(12) United States Patent
Zhang et al.

(10) Patent No.: US 10,818,655 B2
(45) Date of Patent: Oct. 27, 2020

(54) SEMICONDUCTOR DEVICE AND RELATED METHOD OF ADJUSTING THRESHOLD VOLTAGE IN SEMICONDUCTOR DEVICE DURING MANUFACTURE VIA COUNTER DOPING IN DIFFUSION REGION

(71) Applicant: CSMC TECHNOLOGIES FAB1 CO., LTD., Wuxi New District (CN)

(72) Inventors: Guangsheng Zhang, Wuxi New District (CN); Sen Zhang, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 157 days.

(21) Appl. No.: 15/023,049

(22) PCT Filed: Dec. 3, 2014

(86) PCT No.: PCT/CN2014/092964
§ 371 (c)(1),
(2) Date: Mar. 18, 2016

(87) PCT Pub. No.: WO2015/081866
PCT Pub. Date: Jun. 11, 2015

(65) Prior Publication Data
US 2016/0233216 A1 Aug. 11, 2016

(30) Foreign Application Priority Data
Dec. 6, 2013 (CN) .......................... 2013 1 0661381

(51) Int. Cl.
*H01L 29/06* (2006.01)
*H01L 27/088* (2006.01)
(Continued)

(52) U.S. Cl.
CPC ...... *H01L 27/0883* (2013.01); *H01L 21/2652* (2013.01); *H01L 21/8236* (2013.01);
(Continued)

(58) Field of Classification Search
CPC ............. H01L 29/7835; H01L 29/1083; H01L 29/0684; H01L 29/1095; H01L 27/0883; H01L 29/7838
See application file for complete search history.

(56) References Cited

U.S. PATENT DOCUMENTS 5,451,799 A * 9/1995 Kurimoto ........... H01L 27/0266
257/174
9,190,479 B1 * 11/2015 Greenberg .......... H01L 23/4824
(Continued)

FOREIGN PATENT DOCUMENTS

CN 85108671 6/1986
CN 1689144 10/2005
(Continued)

OTHER PUBLICATIONS

Zheng, The Analysis of Double Doping Polysilicon Gate Lightly-Doped-Drain (LDD) MOSFET, ICIMA 2010.*
(Continued)

*Primary Examiner* — Cuong Q Nguyen
*Assistant Examiner* — Shih Tsun A Chou
(74) *Attorney, Agent, or Firm* — Kagan Binder, PLLC

(57) ABSTRACT

A semiconductor device includes a substrate (110); a buried layer (120) formed on the substrate (110), a diffusion layer (130) formed on the buried layer (120), wherein the diffusion layer (130) includes a first diffusion region (132) and a second diffusion region (134), and an impurity type of the second diffusion region (134) is opposite to an impurity type of the first diffusion region (132); the diffusion layer (134) further comprises a plurality of third diffusion regions (136)
(Continued)

formed in the second diffusion region, wherein an impurity type of the third diffusion region (136) is opposite to the impurity type of the second diffusion region (134); and a gate (144) formed on the diffusion layer (130).

11 Claims, 4 Drawing Sheets

(51) Int. Cl.

| | | |
|---|---|---|
| *H01L 21/265* | (2006.01) | |
| *H01L 29/78* | (2006.01) | |
| *H01L 29/10* | (2006.01) | |
| *H01L 21/8236* | (2006.01) | |
| *H01L 29/08* | (2006.01) | |
| *H01L 21/266* | (2006.01) | |
| *H01L 21/8234* | (2006.01) | |

(52) U.S. Cl.
CPC ...... *H01L 29/0634* (2013.01); *H01L 29/0684* (2013.01); *H01L 29/1083* (2013.01); *H01L 29/1095* (2013.01); *H01L 29/7835* (2013.01); *H01L 29/7838* (2013.01); *H01L 21/266* (2013.01); *H01L 21/823412* (2013.01); *H01L 29/0847* (2013.01)

(56) References Cited

U.S. PATENT DOCUMENTS

| | | | |
|---|---|---|---|
| 2004/0238913 | A1 | 12/2004 | Kwon et al. |
| 2006/0223257 | A1* | 10/2006 | Williams .......... H01L 21/26513 438/202 |
| 2010/0032731 | A1* | 2/2010 | Babcock ............... H01L 27/095 257/280 |
| 2010/0301413 | A1* | 12/2010 | You ..................... H01L 27/0922 257/343 |
| 2011/0039378 | A1* | 2/2011 | Voldman .......... H01L 21/82389 438/200 |
| 2011/0241083 | A1* | 10/2011 | Khemka ............. H01L 27/0705 257/262 |
| 2013/0168766 | A1* | 7/2013 | Lee ................... H01L 29/66659 257/335 |

FOREIGN PATENT DOCUMENTS

| | | |
|---|---|---|
| CN | 101359664 A | 2/2009 |
| CN | 101383375 A | 3/2009 |
| WO | 2015/010606 | 1/2015 |
| WO | 2015/014263 | 2/2015 |
| WO | 2015/024502 | 2/2015 |
| WO | 2015/027961 | 3/2015 |
| WO | 2015/103910 | 7/2015 |

OTHER PUBLICATIONS

English Translation of PCT Search Report for International Application No. PCT/CN2014/092964; dated Feb. 15, 2015.
Deng et al., U.S. Appl. No. 14/902,516, International Application Filing Date Jul. 29, 2014.
Zhong et al., U.S. Appl. No. 14/902,517, International Application Filing Date Jul. 22, 2014.
Zhang et al., U.S. Appl. No. 14/902,519, International Application Filing Date Aug. 19, 2014.
Wang et al., U.S. Appl. No. 14/902,302, International Application Filing Date Sep. 2, 2014.
Jing, U.S. Appl. No. 15/023,057, International Application Filing Date Dec. 4, 2014.
First Office Action (and English Translation thereof) and related Search Report for Chinese Application No. 201310661381.3, dated Mar. 1, 2017 (14 pages).

* cited by examiner

SEMICONDUCTOR DEVICE AND RELATED METHOD OF ADJUSTING THRESHOLD VOLTAGE IN SEMICONDUCTOR DEVICE DURING MANUFACTURE VIA COUNTER DOPING IN DIFFUSION REGION

FIELD OF THE INVENTION

The present invention relates to a technical field of semiconductor manufacturing, and particularly relates to a semiconductor device and a manufacturing method thereof.

BACKGROUND OF THE INVENTION

During a manufacturing process of a conventional semiconductor device for a start-up circuit, generally, the semiconductor device is parasitized to obtain a certain threshold voltage according to inherent process conditions, and thus the threshold voltage is unadjustable.

SUMMARY OF THE INVENTION

Accordingly, it is necessary to provide a semiconductor device with changeable thresholds.

A method of manufacturing a semiconductor device with changeable thresholds is also provided.

A semiconductor device includes a substrate; a buried layer formed on the substrate; a diffusion layer formed on the buried layer, wherein the diffusion layer comprises a first diffusion region and a second diffusion region, and an impurity type of the second diffusion region is opposite to an impurity type of the first diffusion region; the diffusion layer further comprises a plurality of third diffusion regions formed in the second diffusion region, wherein an impurity type of the third diffusion region is opposite to the impurity type of the second diffusion region; and a gate formed on the diffusion layer.

In one of embodiments, the plurality of third diffusion regions are arranged regularly spaced from each other.

In one of embodiments, a side length of the third diffusion region is less than or equal to a width of a space between two adjacent third diffusion regions.

In one of embodiments, the impurity type of the third diffusion region is opposite to an impurity type of the gate.

In one of embodiments, the buried layer comprises a first buried layer region and a second buried layer region, an impurity type of the first buried layer region is opposite to an impurity type of the second buried layer region, the impurity type of the first buried layer region is the same as the impurity type of the first diffusion region.

In one of embodiments, the semiconductor device includes: a normally-on type device region and a normally-off type device region, wherein the normally-on type device region and the normally-off type device region each has a first buried layer region and share a second buried layer region, and the normally-on type device region and the normally-off type device region each has a first diffusion region and share a second diffusion region; and a shared drain lead-out region formed at a common boundary of the normally-on type device region and the normally-off type device region in the second diffusion region, wherein the shared drain lead-out region serves as a common drain lead-out region of the normally-on type device region and the normally-off type device region, and an impurity type of the shared drain lead-out region is the same as the impurity type of the second diffusion region.

In one of embodiments, a substrate lead-out region is formed in the first diffusion region of the normally-on type device region, and a source lead-out region is formed in the second diffusion region of the normally-on type device region; an impurity type of the source lead-out region is opposite to an impurity type of the substrate lead-out region, a width of a space between the source lead-out region and the substrate lead-out region is greater than zero.

In one of embodiments, a source lead-out region and a substrate lead-out region are formed in the first diffusion region of the normally-off type device region, and a width of a space between the source lead-out region and the substrate lead-out region is greater than or equal to zero.

In one of embodiments, the semiconductor device is a lateral diffusion metal oxide semiconductor device.

A method of manufacturing a semiconductor device includes: providing a substrate, and forming a buried layer on the substrate; forming a diffusion layer having a first diffusion region and a second diffusion region on the buried layer, wherein an impurity type of the second diffusion region is opposite to an impurity type of the first diffusion region; forming a plurality of third diffusion regions in the second diffusion region, wherein an impurity type of the third diffusion region is opposite to the impurity type of the second diffusion region; and forming a gate, a drain lead-out region, and a source lead-out region of the semiconductor device on the second diffusion region.

In the semiconductor device described above, since the plurality of third diffusion regions are formed in the second diffusion region, and the impurity type of the third diffusion region is opposite to the impurity type of the second diffusion region, a concentration of the second diffusion region can be adjusted and controlled by adjusting the size of the third diffusion region, thereby achieving the control of the threshold voltage of the semiconductor device, and thus the semiconductor device with changeable thresholds is obtained.

DETAILED DESCRIPTION OF THE EMBODIMENTS

The details of one or more embodiments of the invention are set forth in the accompanying drawings and the description below. Other features, objects, and advantages of the invention will be apparent from the description and drawings.

Figure 1:
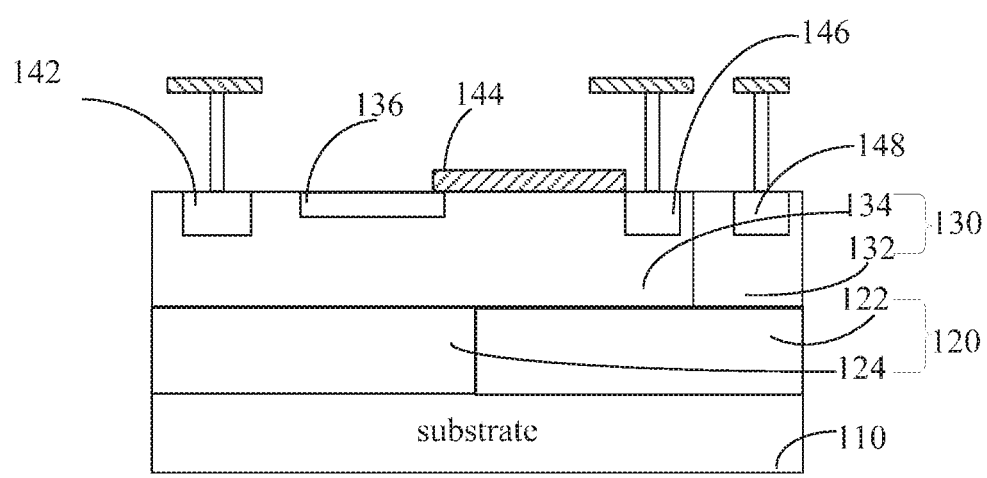
FIG. 1 is a partial cross-sectional view of a semiconductor device in accordance with one embodiment.

FIG. 1 is a cross-section view of a semiconductor device 100 in accordance with one embodiment. In the illustrated embodiment, the semiconductor device 100 is a lateral diffusion metal oxide semiconductor device. The semiconductor device 100 includes a substrate 110. The substrate 110 is made of semiconductor materials known by those skilled in the art. A buried layer 120 is formed on the substrate 110. The buried layer 120 includes a first buried layer region 122 and a second buried layer region 124. The first buried layer region 122 and the second buried layer region 124 are doped via ion implantation, and a dopant impurity type of the first buried layer region 122 is opposite to a dopant impurity type of the second buried layer region 124. In the illustrated embodiment, the buried layer 120 is formed by twice of implantation, which can avoid using too much driving-in to form the buried layer 120. The first buried layer region 122 and the second buried layer region 124 cooperatively form a high voltage withstand region of the device, and the voltage resistance property of the device is improved. A diffusion layer 130 is formed on the buried layer 120. In the illustrated embodiment, the diffusion layer 130 includes a first diffusion region 132 and a second diffusion region 134. An impurity type of the first diffusion region 132 is the same as the impurity type of the first buried layer region 122, and an impurity type of the second diffusion region 134 is opposite to the impurity type of the first diffusion region 132.

In the illustrated embodiment, a plurality of third diffusion regions 136 are formed in the second diffusion region 134. An impurity type of the third diffusion region 136 is opposite to the impurity type of the second diffusion region 134. The plurality of third diffusion regions 136 are formed, and an impurity concentration of the second diffusion region 134 can be adjusted and controlled by adjusting the size of the third diffusion region 136 and the concentration and dose of the implanted ions, thereby achieving the control of the threshold voltage of the semiconductor device 100. Specifically, the third diffusion regions 136 are formed via ion implantation. The third diffusion regions 136 are arranged regularly spaced from each other, and a side length of the third diffusion region 136 is less than or equal to a width of a space between two adjacent third diffusion regions. The side length of the third diffusion region 136 should not be too large, otherwise islands of opposed impurity types will be easily formed in the second diffusion region 134.

A gate 144 is formed on the second diffusion region of the semiconductor device 100. The impurity type of the third diffusion region is opposite to an impurity type of the gate. A thickness of the oxide layer between the gate 144 and the silicon substrate can be configured according to actual needs. A drain lead-out region 142 and a source lead-out region 146 is also formed on the second diffusion region 134, and an impurity type of the drain lead-out region 142 is the same as the impurity type of the second diffusion region 134. A substrate lead-out region 148 is formed on the first diffusion region 132, and an impurity type of the source lead-out region 146 is opposite to an impurity type of the substrate lead-out region 148.

Figure 2:
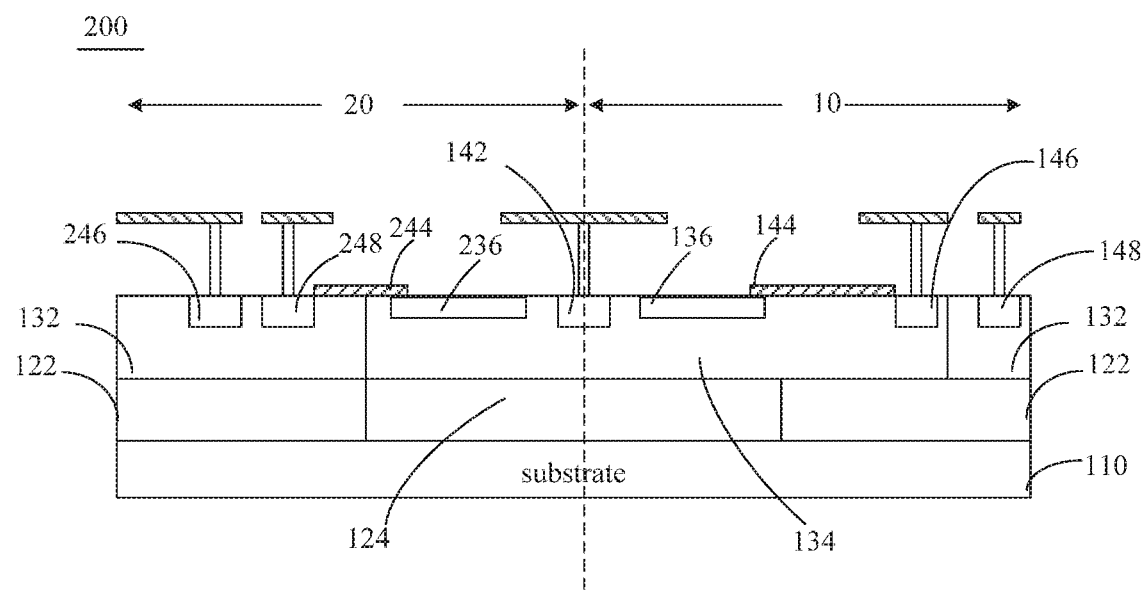
FIG. 2 is a partial cross-sectional view of a semiconductor device in accordance with other embodiment.

In alternative embodiments, the semiconductor device may include a normally-on type device region and a normally-off type device region. Referring to FIG. 2, a semiconductor device 200 includes a normally-on type device region 10 and a normally-off type device region 20. The normally-on type device region 10 and the normally-off type device region 20 each has a first buried layer region 122 and share a second buried layer region 124. The normally-on type device region 10 and the normally-off type device region 20 each has a first diffusion region 132 and share a second diffusion region 134. The semiconductor device 200 further includes a shared drain lead-out region 142 formed at a common boundary of the normally-on type device region 10 and the normally-off type device region 20 in the second diffusion region 134. The shared drain lead-out region 142 serves as a common drain lead-out region of the normally-on type device region 10 and the normally-off type device region 20, thus during layout designing, the area of the device can be greatly reduced, and the design and the commonality of the device is improved. In addition, the normally-on type device and normally-off devices can be obtained at the same time, which greatly simplifies the manufacturing process, and saves the cost. In the illustrated embodiment, an impurity type of the shared drain lead-out region 142 is the same as the impurity type of the second diffusion region 134.

In the illustrated embodiment, the second diffusion region 134 where the normally-on type device region 10 located is provided with the third diffusion regions 136, the gate 144 and the source lead-out region 146. The first diffusion region 132 is provided with the substrate lead-out region 148. A width of a space between the source lead-out region 146 of the normally-on type device region 10 and the substrate lead-out region 148 is greater than zero. When the width of the space between the source lead-out region 146 and the substrate lead-out region 148 equal to zero, the breakdown voltage between them is extremely low, and the device cannot be used. The first diffusion region 132 where the normally-off type device region 20 located is provided with the substrate lead-out region 246 and the source lead-out region 248. The impurity concentration of the substrate lead-out region 246 and the source lead-out region 248 is relatively high, and the width of the space between them is greater than or equal to zero. The second diffusion region 134 where the normally-off type device region 20 located is provided with the third diffusion regions 236, so as to adjust the concentration of the second diffusion region 134, and improve the performance of the device.

Figure 3:
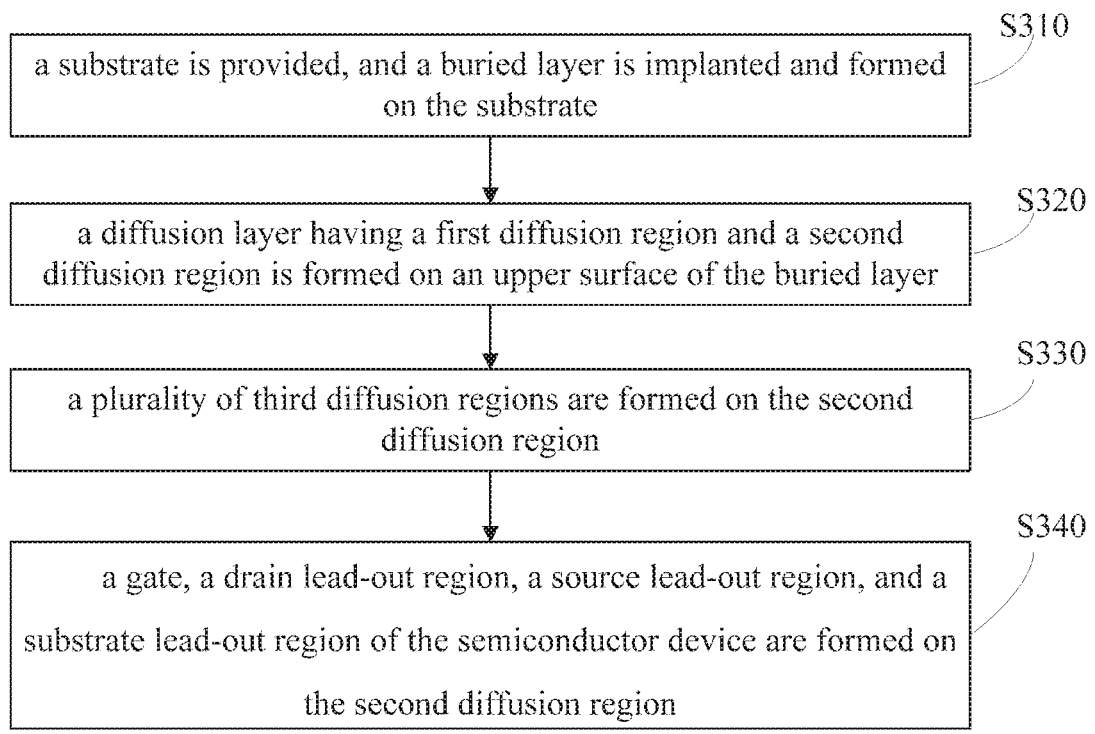
FIG. 3 is a flow chart of a method of manufacturing the semiconductor device in accordance with one embodiment.

Referring to FIG. 3, a method of manufacturing a semiconductor device is also provided, which includes the following steps.

In step S310, a substrate is provided, and a buried layer is implanted and formed on the substrate.

The substrate is made of semiconductor materials known by those skilled in the art. A buried layer is formed on the substrate via ion implantation. In the illustrated embodiment, the buried layer is implanted for twice, i.e. a first buried layer region is formed before a second buried layer region is formed. An impurity type of the first buried layer region is opposite to an impurity type of the second buried layer region. With twice of implantation, too much driving-in can be avoided during forming the buried layer. The first buried layer region and the second buried layer region cooperatively form a high voltage tolerant region of the device, and the voltage resistance properly of the device is improved.

In step S320, a diffusion layer having a first diffusion region and a second diffusion region is formed on an upper surface of the buried layer.

The diffusion layer is formed on the upper surface of the buried layer, and the diffusion layer includes the first diffusion region and the second diffusion region. An impurity type of the second diffusion region is opposite to an impurity type of the first diffusion region. The impurity type of the first diffusion region is the same as the impurity type of the first buried layer region.

In step S330, a plurality of third diffusion regions are formed on the second diffusion region.

Figure 4:
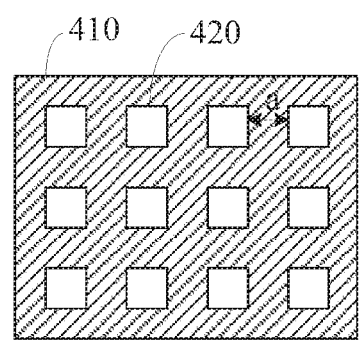
FIG. 4 is a schematic diagram of forming a plurality of third diffusion regions during the method of manufacturing the semiconductor device in accordance with one embodiment.

A layer of photoresist is formed on the second diffusion region, and a plurality of implanting windows are defined on the second diffusion region corresponding to the photoresist. FIG. 4 is a top view of the photoresist having the implanting windows. The photoresist 410 is located on the diffusion region, and the plurality of implanting windows 420 of the third diffusion regions are defined on the second diffusion region. Dopant impurities are implanted via the implanting windows 420; a dopant impurity type of the third diffusion region is opposite to the impurity type of the second diffusion region. The implantation is performed according to a certain proportion, the plurality of third diffusion regions are formed in the second diffusion region to adjust an impurity concentration of the second diffusion region, and thus the threshold voltage of the semiconductor device is changeable. In the illustrated embodiment, the implanting windows 420 are arranged regularly spaced from each other. The shape of the implanting window 420 can be designed according to actual need. In the illustrated embodiment, the implanting window has a shape of square, and in alternative embodiments, the implanting window may also be other shapes. The size of the implanting windows and the width of the space between the implanting windows can be adjusted according to different threshold voltages. Different threshold voltages correspond to different sizes of the implanting windows and different widths of the space between the implanting windows. In the illustrated embodiment, the implanting windows shall not be too large, the side length of the implanting window should be less than or equal to the width of the width of the space between the implanting windows, otherwise, when the implanting window is too large, islands of opposed impurity types will be easily formed in the second diffusion region.

In step S340, a gate, a drain lead-out region, a source lead-out region, and a substrate lead-out region of the semiconductor device are formed on the second diffusion region.

The gate, the drain lead-out region, and the source lead-out region are formed on the second diffusion region, and the substrate lead-out region is formed in the first diffusion region. An impurity type of the drain lead-out region is the same as the impurity type of the second diffusion region, while an impurity type of the source lead-out region is opposite to an impurity type of the substrate lead-out region.

In another embodiment, if the semiconductor device is a device including a normally-on type device region and a normally-off type device region, during manufacturing, the normally-on type device region and the normally-off type device region are manufactured at the same time. When manufacturing the buried layer, the normally-on type device region and the normally-off type device region each has a first buried layer region and share a second buried layer region; the normally-on type device region and the normally-off type device region each has a first diffusion region and share a second diffusion region. After finishing manufacturing the buried layer and the diffusion layer, the method further includes a step of forming a shared drain lead-out region, which is formed at a common boundary of the normally-on type device region and the normally-off type device region in the second diffusion region. An impurity type of the shared drain lead-out region is the same as the impurity type of the second diffusion region. The shared drain lead-out region serves as a common drain lead-out region of the normally-on type device region and the normally-off type device region, during designing, the area of the device can be greatly reduced, and the design of the device is improved. In addition, the normally-on type device and normally-off type device can be obtained at the same time, which greatly simplifies the manufacturing process, and saves the cost.

In the illustrated embodiment, the method further includes a step of forming the gate, the drain lead-out region, and the source lead-out region is formed on the second diffusion layer where the normally-on type device region located, and forming the substrate lead-out region in the first diffusion region. A width of a space between the source lead-out region of the normally-on type device region and the substrate lead-out region is greater than zero. When the width of the space between the source lead-out region and the substrate lead-out region equal to zero, the breakdown voltage between them is extremely low, and the device cannot be used. The first diffusion region where the normally-off type device region located is provided with the substrate lead-out region and the source lead-out region. The impurity concentration of the substrate lead-out region and the source lead-out region is relatively high, and the width of the space between them is greater than or equal to zero. The second diffusion region where the normally-off type device region located is provided with the third diffusion regions, so as to adjust the concentration of the second diffusion region, and improve the performance of the device.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A device, comprising:
a first lateral diffusion metal oxide device in a first device region, comprising:
a substrate;
a buried layer formed on the substrate;
a diffusion layer formed directly on the buried layer, wherein the diffusion layer comprises a first diffusion region and a second diffusion region, and an impurity type of the second diffusion region is opposite to an impurity type of the first diffusion region; the diffusion layer further comprises a plurality of third diffusion regions formed in the second diffusion region, wherein an impurity type of the plurality of third diffusion regions is opposite to the impurity type of the second diffusion region, wherein a substrate lead-out region is formed in the first diffusion region, wherein a source lead-out region and a drain lead-out region are formed in the second diffusion region, wherein the plurality of third diffusion regions are located between and separated from the drain lead-out region and the source lead-out region; and
a gate formed on the second diffusion region of the diffusion layer between the drain lead-out region on a first side of the gate, and the source lead-out region on a second side of the gate opposite the first side.

2. The device of claim 1, wherein the plurality of third diffusion regions are arranged regularly spaced from each other.

3. The device of claim 2, wherein a side length of the third diffusion region is less than or equal to a width of a space between two adjacent third diffusion regions.

4. The device of claim 1, wherein the impurity type of the third diffusion region is opposite to an impurity type of the gate.

5. The device of claim 1, wherein the buried layer comprises a first buried layer region and a second buried layer region, an impurity type of the first buried layer region is opposite to an impurity type of the second buried layer region, the impurity type of the first buried layer region is the same as the impurity type of the first diffusion region.

6. The device of claim 5, further comprising:
a second lateral diffusion metal oxide device in a second device region;
wherein the first device region is a normally-on type device region and the second device region is a normally-off type device region, wherein the first device region comprises the first buried layer region and the second device region comprises another first buried layer region, wherein the impurity type of the first buried layer region is the same as an impurity type of the another first buried layer region, wherein the second buried layer region is located between the first buried layer region and the another first buried layer region, wherein the first device region and the second device region share the second buried layer region, wherein the first device region comprises the first diffusion region and the second device region comprises another first diffusion region, wherein the impurity type of the first diffusion region is the same as an impurity type of the another first diffusion region, wherein the second diffusion region is located between the first diffusion region and the another first diffusion region, wherein the first device region and the second device region share the second diffusion region; and
wherein the drain lead-out region is a shared drain lead-out region formed at a common boundary of the first device region and the second device region in the second diffusion region, wherein the shared drain lead-out region serves as a common drain lead-out region of the first device region and the second device region, and an impurity type of the shared drain lead-out region is the same as the impurity type of the second diffusion region.

7. The device of claim 6, wherein an impurity type of the source lead-out region is opposite to an impurity type of the substrate lead-out region, a width of a space between the source lead-out region and the substrate lead-out region is greater than zero.

8. The device of claim 6, further comprising another source lead-out region and another substrate lead-out region in the another first diffusion region of the second device region, and a width of a space between the another source lead-out region and the another substrate lead-out region is greater than or equal to zero.

9. The device of claim 1, wherein the plurality of third diffusion regions are present only in the second diffusion region.

10. The device of claim 1, wherein the first device region is a normally-on type device region.

11. The device of claim 1, wherein the first device region is a normally-off type device region.

* * * * *